United States Patent
Neto

(10) Patent No.: US 10,236,901 B1
(45) Date of Patent: Mar. 19, 2019

(54) CIRCUIT FOR AND METHOD OF IMPLEMENTING ASYNCHRONOUS CLOCK GENERATION

(71) Applicant: Xilinx, Inc., San Jose, CA (US)

(72) Inventor: Pedro W. Neto, Douglas (IE)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/991,767

(22) Filed: May 29, 2018

(51) Int. Cl.
*H03M 1/12* (2006.01)
*H03M 1/46* (2006.01)

(52) U.S. Cl.
CPC .......... *H03M 1/125* (2013.01); *H03M 1/462* (2013.01); *H03M 1/466* (2013.01)

(58) Field of Classification Search
CPC ....... H03M 1/125; H03M 1/462; H03M 1/466
USPC ................... 341/155, 161–163, 172
See application file for complete search history.

(56) References Cited

U.S. PATENT DOCUMENTS

| 7,574,635 B1 | 8/2009 | Alfke |
| 8,362,940 B2 * | 1/2013 | Yoshioka ............. H03L 7/0812 |
| | | 341/118 |
| 8,995,514 B1 | 3/2015 | Asuncion et al. |
| 9,503,058 B1 | 11/2016 | Cical et al. |

* cited by examiner

*Primary Examiner* — Khai M Nguyen
(74) *Attorney, Agent, or Firm* — John K. King

(57) ABSTRACT

A circuit for asynchronous clock generation is described. The circuit comprises a first comparator configured to receive an analog input signal; a second comparator configured to receive the analog input signal; and a clocking circuit coupled to the first comparator and the second comparator; wherein the clocking circuit generates a first asynchronous clock signal for the first comparator and a second asynchronous clock signal for the second comparator. A method of providing asynchronous clock generation is also described.

20 Claims, 4 Drawing Sheets

CIRCUIT FOR AND METHOD OF IMPLEMENTING ASYNCHRONOUS CLOCK GENERATION

TECHNICAL FIELD

The present invention relates generally to integrated circuit devices, and in particular to a circuit for and a method of implementing an analog-to-digital converter.

BACKGROUND

Comparators are frequently used in analog-to-digital converters (ADCs) to make decisions related to input signal voltage or current levels, where the decision is usually made with respect to a reference signal. On a circuit level, the comparator may be implemented using clocked latch circuitry. The clocked latch circuitry causes the output of the comparator to latch on high or low supply levels input to the comparator.

Successive Approximation Register ADCs (SAR-ADCs) are digital-to-analog converters that, in each conversion cycle, perform a sequence of comparisons and approximations (i.e. SA cycles) between the sampled input voltage and an internal digitally controlled reference, until the remaining difference is smaller than a predefined error threshold (VLSB). In practical implementations, the comparison function is implemented by a clocked comparator and the internal digitally controlled reference is implemented by a DAC (Digital to Analog Converter). In some SAR-ADC designs, a capacitive digital-to-analog converter (CDAC) holds the input sampled signal at the comparator inputs. In high-speed ADCs, smaller capacitors values of the CDAC are used to realize high conversion rates.

For each Successive Approximation (SA) loop in a conversion cycle, the comparator delay is a significant factor limiting the converter speed. The comparator delay has a component associated to the activation of the comparator after a rise in the clock signal. This delay is generally fixed and has a small dependency on the input voltage amplitude. Another delay component is associated with the comparator reset time. This delay is also considered generally constant and can be an important portion of the total fixed delay. The third component in the comparator delay is a variable delay associated with the comparator's regenerative response. This delay is a metastable delay and varies with the input signal amplitude, and therefore a bigger delay for smaller input amplitude.

In a SAR conversion cycle, each SA loop duration will have a variable minimum duration due to the comparator variable delay. If a synchronous clock scheme is used to trigger the comparator, the worst-case estimation for the comparator delay must be allocated in each SA loop.

Accordingly, there is a need for an ADC that addresses issues with delay in the SAR conversion cycle.

SUMMARY

A circuit for asynchronous clock generation is described. The circuit comprises a first comparator configured to receive an analog input signal, detect and report a valid decision condition; a second comparator configured to receive the analog input signal, detect and report a valid decision condition; and a clocking circuit coupled to the first comparator and the second comparator; wherein the clocking circuit generates a first asynchronous clock signal for the first comparator and a second asynchronous clock signal for the second comparator.

A method of asynchronous clock generation is also described. The method comprises configuring a first comparator to receive an analog input signal, detect and report a valid decision condition; configuring a second comparator to receive the analog input signal, detect and report a valid decision condition; and coupling a clocking circuit to the first comparator and the second comparator; generating, by the clocking circuit, a first asynchronous clock signal for the first comparator and a second asynchronous clock signal for the second comparator.

DETAILED DESCRIPTION

The circuits and methods set forth below relate to a relaxation oscillator that generates asynchronous clock references for a successive approximation ADC using time interleaved comparators. The oscillator uses the comparators to generate internal delays in such a way that each comparator has enough time to reach a valid comparison in each successive approximation (SA) cycle.

A clocking circuit is implemented that allows for the start and reset of the asynchronous clocks independently. The clocking circuit provides power savings by enabling stopping the clock on the end of an SA cycle if the SA cycle ends before the conversion period ends. The circuit may also implement programmable delays in the asynchronous clock paths that can be used, for example, to improve the DAC setting time over process, temperature and voltage (PVT) variations.

One technique used to improve the SAR ADC speed is to detect that the comparator reached a valid decision, in each SA cycle, and use the detection signal to trigger the next comparison (next SA cycle). The resultant clock is asynchronous to the ADC reference clock, but, in each SA cycle, the comparator has allocated only the necessary delay instead of an worst case estimation, as in a synchronous clock scheme.

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

Figure 1:
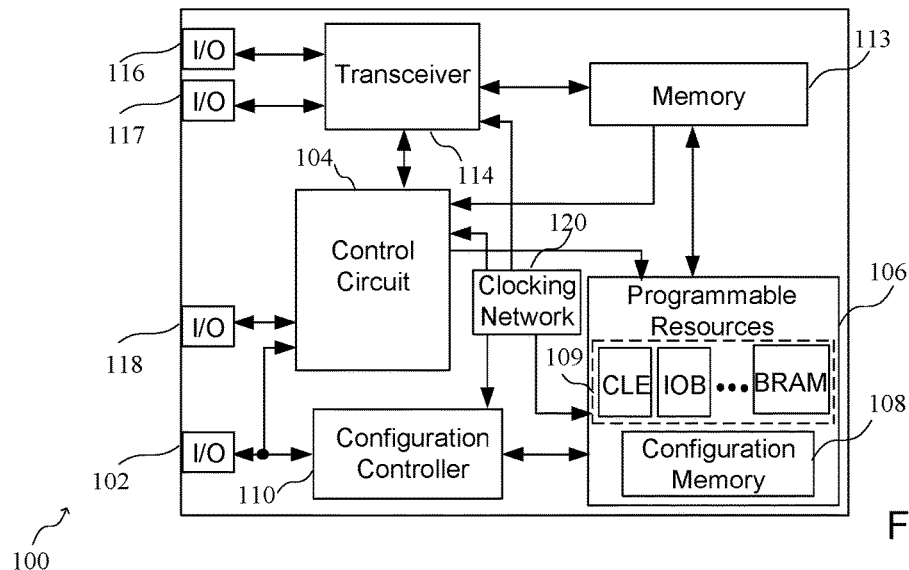
FIG. 1 is a block diagram of an integrated circuit having circuits for transmitting and receiving data.

Turning first to FIG. 1, a block diagram of an integrated circuit device 100 having a transceiver for transmitting and receiving data is shown. In particular, an input/output port 102 is coupled to a control circuit 104 that controls programmable resources 106 having configurable logic elements 109 and other programmable resources, such as input/output blocks (IOBs) and blocks of random access memory (BRAMs). Configuration data may be provided to the configuration memory 108 by a configuration controller 110. The configuration data enables the operation of the programmable resources 106. A memory 113 may be coupled to the control circuit 104 and the programmable resources 106. A transceiver circuit 114, which comprises a transmitter and a receiver, may be coupled to the control circuit 104, programmable resources 106 and the memory 113, and may receive signals at the integrated circuit by way of I/O ports 116 and 117. Other I/O ports may be coupled to circuits of the integrated circuit device, such as I/O port 118 that is coupled to the control circuit 104 as shown. A clocking network 120 is coupled to various elements of the circuit of FIG. 1. While the circuit of FIG. 1 is provided by way of example, the circuits for and methods of implementing an ADC circuit can use other circuit elements.

Figure 2:
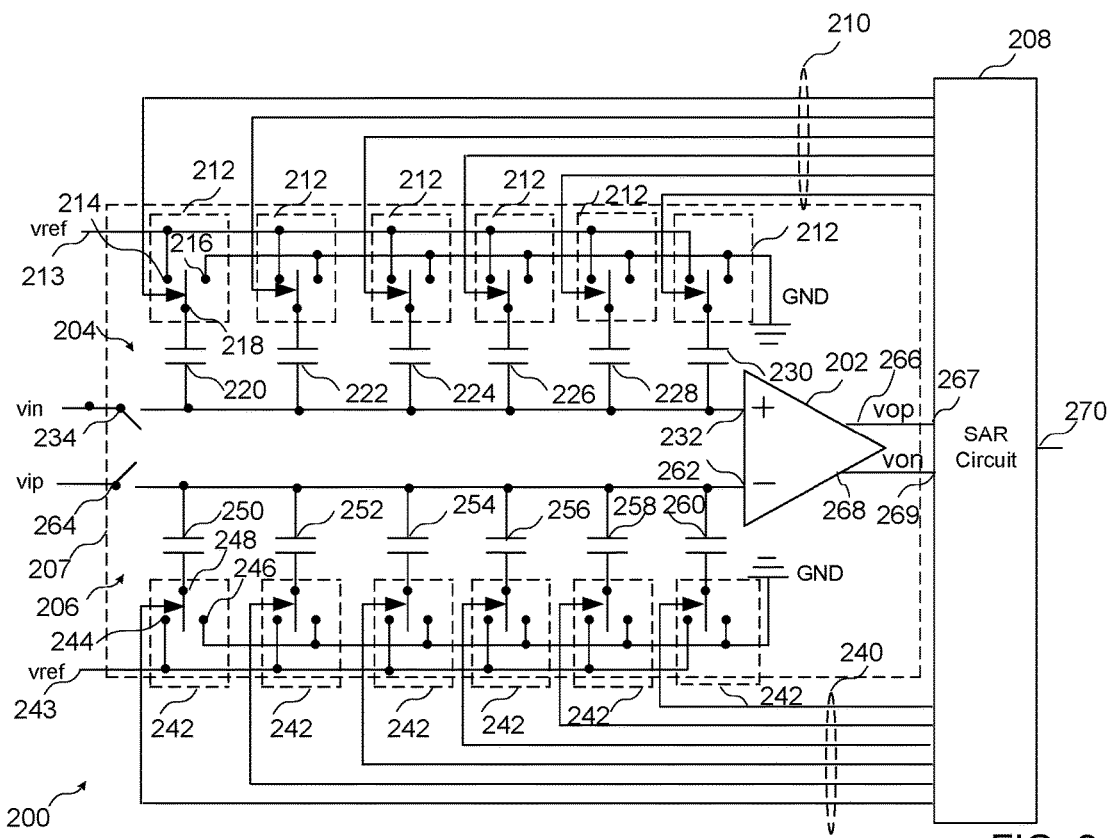
FIG. 2 is a block diagram of an SAR-based analog-to-digital converter circuit that may be implemented in the receiver of FIG. 1.

Turning now to FIG. 2, a block diagram of an SAR-based analog-to-digital converter circuit 200 that may be implemented in the receiver of FIG. 1 is shown. The SAR-based analog-to-digital converter circuit 200 comprises a comparator circuit 202, operating as a single bit analog-to-digital converter, coupled to a first capacitive network 204 and a second capacitive network 206 that forms a CDAC circuit 207. A Successive Approximation Register (SAR) circuit 208 is coupled to an output of the comparator circuit 202, and controls the operation of the first capacitive network 204 and the second capacitive network 206 to determine a value of an input signal. More particularly, first control lines 210 comprises a plurality of control lines having a control line for each of a plurality of switches 212 controlling a corresponding capacitor. The switch 212 comprises a first terminal 214 coupled to a reference voltage (vref) at a reference voltage node 213 and a second terminal 216 coupled to a ground voltage (GND). The switch 212 enables the routing of either the reference voltage or the ground voltage to a node 218 of the switch that is coupled to a first terminal of a corresponding capacitor. Six capacitors 220-230 are shown, where a corresponding switch 212 controls the application of either the reference voltage or ground voltage to the first terminal of the capacitor. A second terminal of the each of the capacitors 220-230 is coupled to a first input 232 of the comparator circuit 202. A first input voltage (yin) of a differential pair of analog input voltages is also coupled to the input 232 by way of a switch 234.

Second control lines 240 comprises a plurality of control lines having a control line for each of a plurality of switches 242 controlling a corresponding capacitor. Each switch 242 comprises a first terminal 244 coupled to the reference voltage and a second terminal 246 coupled to the ground voltage. The switch 242 enables the routing of either the reference voltage or the ground voltage to a node 248 of the switch that is coupled to a first terminal of a corresponding capacitor. Six capacitors 250-260 are shown, where a corresponding switch 242 controls the application of either the reference voltage (at the reference voltage node 243) or ground voltage to the first terminal of the capacitor. A second terminal of the each of the capacitors 250-260 is coupled to a second terminal 262 of the comparator circuit 202. A second input voltage (vip) of a differential pair of analog input voltages is also coupled to the input terminal 262 by way of a switch 264. Differential digital outputs von and vop are coupled to corresponding inputs of the SAR circuit 208. In particular, an output 266 of the comparator circuit 202 is coupled to a corresponding input 267 of the SAR circuit 208, and an output 268 is coupled to a corresponding input 269 of the SAR circuit 208. A determination of the input voltages yin and vip are generated at an output 270 of the SAR circuit.

In operation, the switches 234 and 264 are closed, allowing the yin signal to charge the capacitors 220-230 and the vip signal to charge to capacitors 250-260 in a first stage, where the switches 212 are set so that the node 218 is coupled to the second reference terminal 216 and the switches 242 are set so that the nodes 248 are coupled to the second terminal 246 to enable the capacitors to charge. The values at the inputs 232 and 262 represent captured differential analog input signals associated with the differential analog input signals yin and vip. The switches 212 and 242 are then sequentially decoupled, where a comparison is made to determine the value of the input signal.

Figure 3:
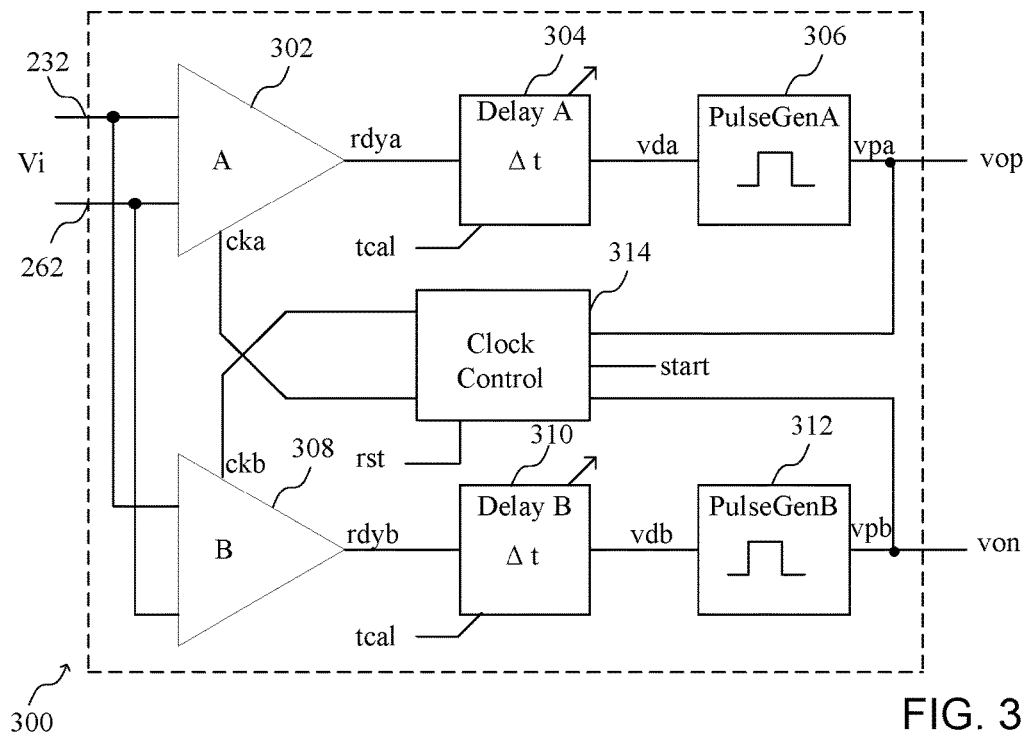
FIG. 3 is a block diagram of a circuit for implementing asynchronous time reference signals.

Turning now to FIG. 3, a block diagram of an asynchronous clock generation circuit for implementing asynchronous time references is shown. More particularly, the circuit 300 of FIG. 3 comprises a first comparator 302 having an input configured to receive an input signal, shown here as differential input signal Vi comparing Vin and Vip. The circuit 300 delivers a first clock signal (cka) at a clock output to generate a first ready signal (rdya). The first ready signal is coupled to a first delay element 304 that generates a delayed ready signal vda. A first pulse generator 306 receives the delayed ready signal vda and generates a first pulse signal vpa, as will be described in more detail in reference to FIG. 4. The circuit 300 of FIG. 3 also comprises a second comparator 308 having an input configured to receive an input signal. The circuit 300 receives a second clock signal (ckb) at a clock output to generate a second ready signal (rdyb). The second ready signal is coupled to a second delay element 310 that generates a delayed ready signal vdb. A second pulse generator 312 receives the delayed ready signal vdb and generates a first pulse signal vpb.

A dynamic logic circuit 314 acts as a pulsed set-reset latch generating asynchronous clock signal. The clocking circuit is coupled to receive the vpa and vpb signals generated by the pulse generators 306 and 312, respectively, and start and reset signals to generate the clock signals cka and ckb, as will be described in more detail in reference to FIGS. 5 and 6. According to one implementation, the circuit 314 generates the asynchronous clock references for a successive approximation ADC, with time interleaved comparators. The circuit 300 uses the comparators to generate the internal delay, in such a way that each comparator has enough time to reach a valid comparison in each successive approximation (SA) cycle. Rst is the reset signal for the high-speed set-reset device and start is the oscillation starting signal.

The circuit operation can be understood by analyzing the system as a ring oscillator. At the initial state, it is assumed that the system is in a reset state (e.g. rst is high and start is high), cka, ckb, rdya, rdyb, vda, vdb and vpa, vpb are high. When the reset signal rst changes from high to low, the circuit will maintain its state until the arrival of the start signal (i.e. start switches from high to low). Once the start signal arrives, clka turns from low to high, the comparator A will sample its inputs, evaluate the data, put a valid comparison in its output and set the rdya signal from low to high. After a digitally controllable delay, Δt, the signal vda will switch from low to high, triggering the pulse in vpa. The vpa pulse will set the clock ckb from low to high and the clock cka from high to low (i.e. comparator A goes to reset phase). The comparator B will sample its inputs, evaluate the data, put a valid comparison in its outputs and set the rdyb signal from low to high. After a digitally controllable delay Δt, the signal vdb will switch from low to high, triggering the pulse in vpb. The vpb pulse will set the clock cka from low to high and the clock ckb from high to low (i.e. comparator B goes to reset phase). This oscillating process will repeat itself until the signal rst goes from low to high (i.e. reset state is activated). Once the reset state is active, vpa/vpb are set to high and the remaining signals are set to low. The programmable delay may be implemented by a bench of switched capacitors connected between the rdy output of each comparator and the low voltage supply for example.

Figure 4:
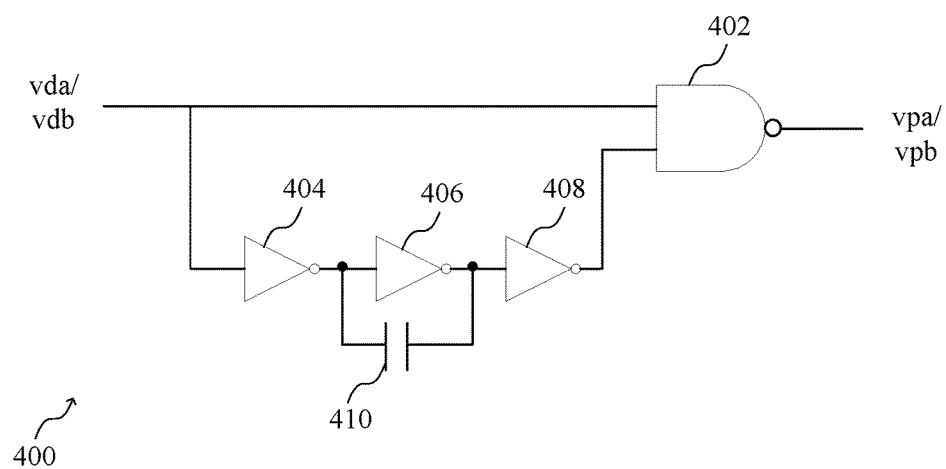
FIG. 4 is a block diagram of a pulse generator that may be used in the circuit of FIG. 3.

Turning now to FIG. 4, a block diagram of a pulse generator 400 that may be used in the comparator circuits of FIG. 3 is shown. More particularly, one of the delayed ready signals vda and vdb is coupled to a first input of a NAND gate 402 and an input of an input of a series of inverters 404-408, and output of which is coupled to a second input of the NAND gate 402. A capacitor 410 comprises a first terminal coupled to an input of the inverter 406 and a second terminal coupled to an output of the inverter 406.

The pulse generation circuits 306 and 312 are implemented as shown in FIG. 4, by a NAND with one input directly connected to the input signal and the other input connected to a delayed version of the input signal. When the direct path changes from zero to one the NAND sees two high voltages at its inputs and go low. After the delay through the path with the inverters has elapsed, the NAND sees one high and one low at its inputs and the output goes high. The only condition for having the NAND output low in this circuit is to have both NAND inputs set to high, which happens only in the period between the rising edge of the input and the moment when the delayed path inverts its input. Thus, the circuit generates a pulse on each rising edge of its input, where the pulse duration is the duration of the delay in the delayed path. While the delay path in this exemplary implementation the delayed path is implemented by three inverters in series, other delay circuits could be used. The capacitor 410 may be included in parallel with the inverter in the middle to increase the delay without increasing the total footprint significantly. This capacitor generates an equivalent capacitor at the input of the middle inverter that is equivalent to the middle capacitor multiplied by the middle inverter gain (i.e. the Miller effect).

Figure 5:
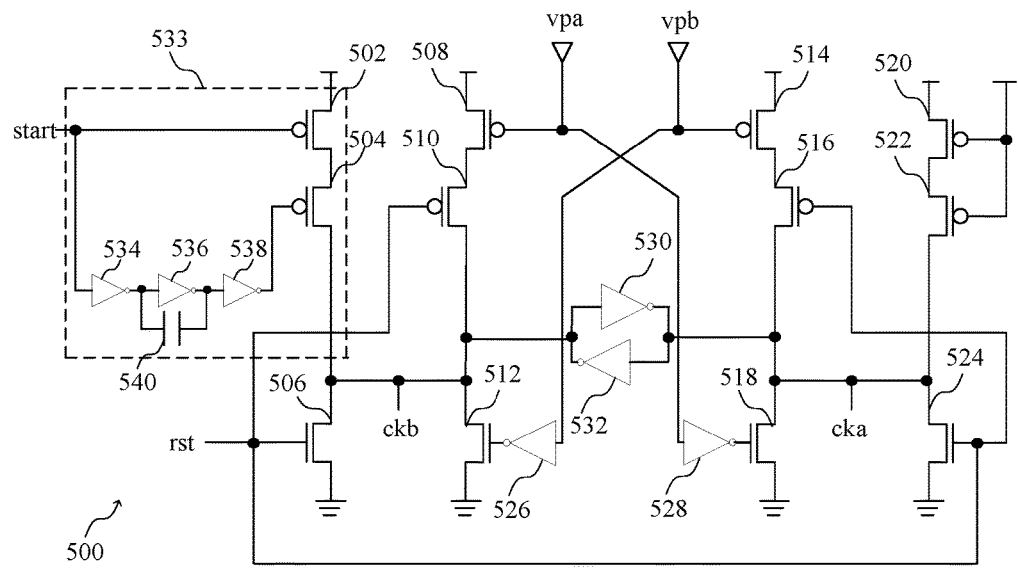
FIG. 5 is a block diagram of a set-reset circuit that may be used in the comparator circuit of FIG. 3.

Turning now to FIG. 5, a block diagram of a set-reset circuit that may be used in the comparator circuit of FIG. 3 is shown. More particularly, the set-clocking circuit 500 of FIG. 5 comprises a first pair of current paths including a first current path having a first series of transistors 502-506 and a second current path having a second series of transistors 508-512 coupled in parallel between a reference voltage (e.g. VCC) and ground. The pulsed set-reset circuit 500 of FIG. 5 also comprises a second pair of current paths including a third current path having a series of transistors 514-518 and a fourth series of transistors 520-542 coupled in parallel between the reference voltage and ground. The vpb signal is coupled to the gate of transistor 514 and an input to an inverter 526, an output of which is coupled to a gate of the transistor 512. The vpa signal is coupled to the gate of the transistor 508 and to an input of an inverter 528, an output of which is coupled to a gate of transistor 518. A pair of cross coupled inverters 530 and 532 are coupled together as shown and between the drains of the transistors 506 and 518. A start circuit 533 receives the start signal, which is provided to a gate of the transistor 502 and to a gate of a transistor 504 by way of a delay circuit having a series of inverters 534-538. A capacitor 540 is coupled between the input of the inverter 536 and an output of the inverter 536. The rst signal is provided to the gates of the transistor 506, 510, 516, and 524. The drains of transistors 506 and 512 are coupled together to generate the ckb signal, and the drains of transistors 518 and 524 are coupled together to generate the cka signal. The start circuit 533 receives a first start signal to allow a start and reset of the first asynchronous clock signal independently to enable power savings by stopping the first asynchronous clock signal at the end of a synchronous approximation cycle.

Figure 6:
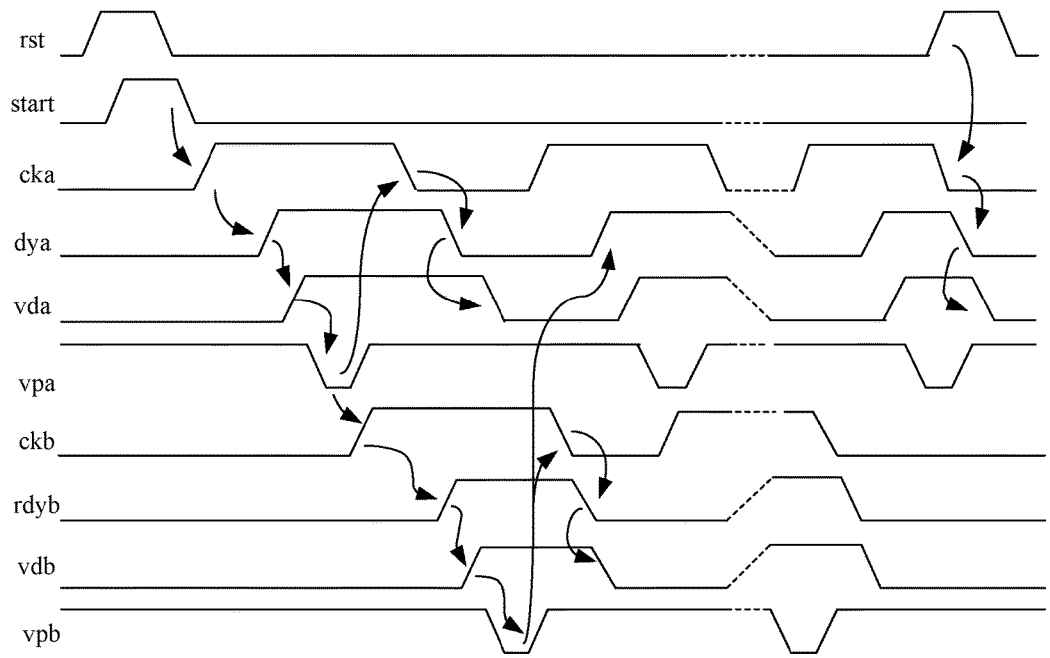
FIG. 6 is a timing diagram showing the operation of the asynchronous clock generator circuit of FIG. 3.

Turning now to FIG. 6, a timing diagram shows the operation of the comparator circuit of FIG. 5. When the signal rst is at a high voltage, transistors 506 and 524 pull the output voltages ckb and cka to the low voltage. At the same time, transistors 510 and 516 are turned off, avoiding low resistance paths through transistors 508-512 and 514-518. When the reset signal is turned to the low voltage the circuit remains in the reset state until the arrival of the start signal (start signal switches from high to low). When the start signal switches from high to low, the transistor 502 is turned ON and, assuming that the transistor 504 was off, the output ckb is pulled to the high voltage supply. After a delay, defined by the delay line between the start signal and the gate of transistor 504, the transistor 504 is cut OFF and circuit operation is controlled by vpa and vpb inputs.

When vpa is switched from high to low, rst is low and vpb is high, the output ckb is pulled high through transistors 508/510 and, after an inverter delay, the output cka is pulled low trough transistor 518.

When vpb is switched from high to low, rst is low and vpb is high, the output cka is pulled high through transistors 514/516 and, after an inverter delay, the output ckb is pulled low trough transistor 512. The back-to-back inverters between ckb and cka are added to ensure that the voltages at ckb and cka remain bounded by the supply voltages. Transistors 520/522 are added to keep the symmetry between the parasitics in nodes for ckb and cka.

It should be noted that while the circuit of FIG. 5 is described based upon rising edges, the architecture could be easily extended to falling edge clocks. While the circuit also assumes that the ready (rdy) signal has an inverse logic, an inverter could be implemented between the ready signal and the delay circuit for a high reset state and a low on during a normal operation mode. If the circuit is configured to allow the transistor voltages to go above the supply used in the set-reset circuit, the inverters 530 and 532 between Q and Qb could be removed to increase the speed and reduce power, but may make the circuit susceptible to charge injection and clock feed-through effects. That is, Q and Qb can go above and below the supply voltage, where reliability can be an issue. If necessary, the start circuitry 533 can be used to replace transistors 520 and 522, as described in reference to FIG. 7.

Figure 7:
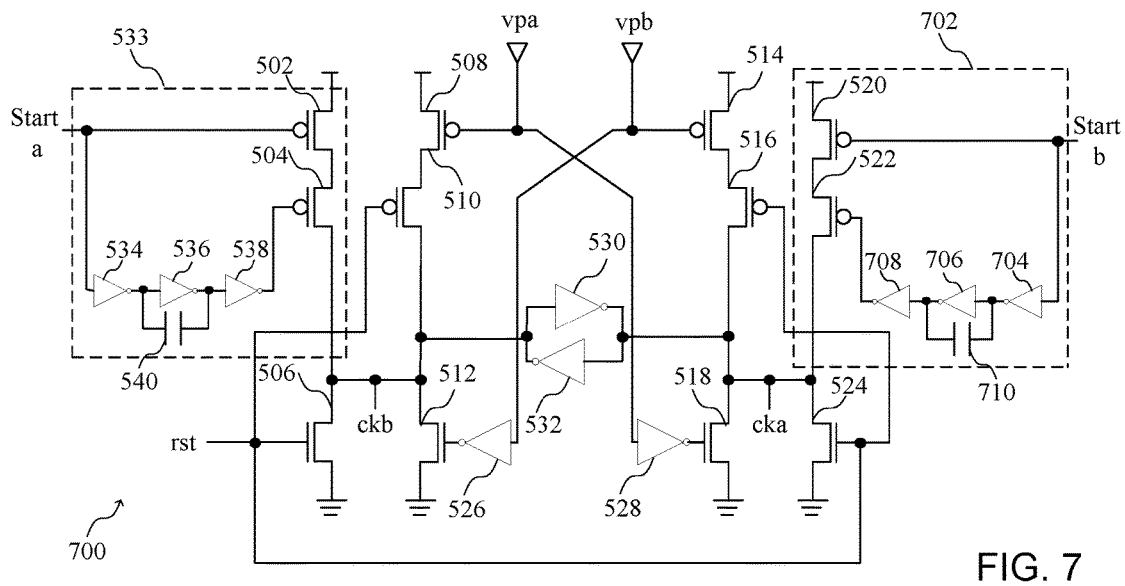
FIG. 7 is a block diagram of a set-reset circuit having separate start signals that may be used in the comparator circuit of FIG. 3.

Turning now to FIG. 7, a block diagram of a circuit 700 having separate start signals that may be used in the comparator circuit of FIG. 3 is shown. More particularly, a second start circuit 702 is coupled to the transistors 520 and 522 and comprises a series of inverters 704-708 having a capacitor 710 coupled across the inputs and outputs of an inverter 706. According to the implementation of FIG. 7, start a is implemented separate from start b. By implementing 2 independent start circuits, it is possible to alternate between start circuits, such as for calibration purposes.

Figure 8:
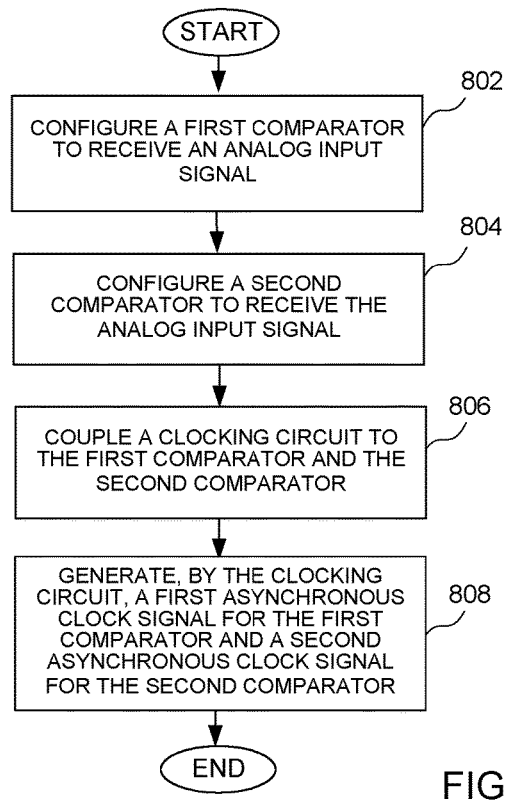
FIG. 8 is a flow chart showing a method of implementing an asynchronous clock generator.

Turning now to FIG. 8, a flow chart shows a method of implementing asynchronous clock generation for time interleaved comparators. More particularly, a first comparator, such as comparator 302, is configured to receive an analog input signal at a block 802. A second comparator, such as comparator 308, is configured to receive the analog input signal at a block 804. A clocking circuit, such as clocking circuit 314, is coupled to the first comparator and the second comparator at a block 806. A first asynchronous clock signal for the first comparator and a second asynchronous clock signal for the second comparator is generated, by the clocking circuit, at a block 808.

It should be noted that the first comparator and the second comparator comprise time interleaved comparators. The circuit for receiving input data may further comprise a first programmable delay element configured to receive an output of the first comparator and a second programmable delay element configured to receive an output of the second comparator. The clocking circuit may receive a reset signal for generating the first asynchronous clock signal and the second asynchronous clock signal. The clocking circuit may further receive a start signal allow the start and reset of the first asynchronous clock signal independently and for power saving by stopping the clock at the end of a synchronous approximation cycle. According to some implementations, a first start circuit and a second start circuit may be employed. The circuit may further comprise a pair of back-to-back invertors coupled between a first output for generating the first asynchronous clock signal and a second output for generating the second asynchronous clock signal. The circuit may further comprise a capacitive digital-to-analog converter, and more particularly a successive approximation register analog-to-digital converter.

The method of FIG. 8 may be implemented using the circuits of FIGS. 1-7 as described, or using some other suitable circuits. While specific elements of the method are described, it should be understood that additional elements of the method, or additional details related to the elements, could be implemented according to the disclosure of FIGS. 1-7.

It can therefore be appreciated that new circuits for and methods of implementing asynchronous clock generation for time interleaved comparators have been described. It will be appreciated by those skilled in the art that numerous alternatives and equivalents will be seen to exist that incorporate the disclosed invention. As a result, the invention is not to be limited by the foregoing implementations, but only by the following claims.

I claim:

1. A circuit for generating asynchronous clock signals, the circuit comprising:
    a first comparator configured to receive an analog input signal;
    a second comparator configured to receive the analog input signal; and
    a clocking circuit coupled to the first comparator and the second comparator;
    wherein the clocking circuit generates a first asynchronous clock signal for the first comparator and a second asynchronous clock signal for the second comparator.

2. The circuit of claim 1, wherein the first comparator and the second comparator comprise time interleaved comparators.

3. The circuit of claim 1, further comprising a first delay element configured to receive an output of the first comparator and a second delay element configured to receive an output of the second comparator.

4. The circuit of claim 1, wherein the clocking circuit receives a reset signal for generating the first asynchronous clock signal and the second asynchronous clock signal.

5. The circuit of claim 4, further comprising a first start circuit receiving a first start signal to allow a start and reset of the first asynchronous clock signal independently to enable power savings by stopping the first asynchronous clock signal at the end of a synchronous approximation cycle.

6. The circuit of claim 1, further comprising a second start circuit, wherein one of the first start circuit and the second start circuit is selected to start the clocking circuit.

7. The circuit of claim 1, further comprising a pair of back-to-back invertors coupled between a first output for generating the first asynchronous clock signal and a second output for generating the second asynchronous clock signal.

8. The circuit of claim 1, wherein the circuit for receiving input data comprises a asynchronous clock generation circuit.

9. The circuit of claim 8, further comprising an SAR circuit coupled to receive outputs of the first comparator and the second comparator.

10. The circuit of claim 9, further comprising a capacitive digital-to-analog converter having a first plurality of capacitors coupled to the first input of the first comparator and the second comparator and a second plurality of capacitors coupled to a second input of the first comparator and the second comparator.

11. A method of generating asynchronous clock signals, the method comprising:
    configuring a first comparator to receive an analog input signal;
    configuring a second comparator to receive the analog input signal; and
    coupling a clocking circuit to the first comparator and the second comparator;
    generating, by the clocking circuit, a first asynchronous clock signal for the first comparator and a second asynchronous clock signal for the second comparator.

12. The method of claim 11, wherein configuring a first comparator and a second comparator comprises configuring the first comparator and the second comparator as time interleaved comparators.

13. The method of claim 11, further comprising configuring a first programmable delay element to receive an output of the first comparator and configuring a second programmable delay element to receive an output of the second comparator.

14. The method of claim 11, further comprising receiving a reset signal at the clocking circuit to for generating the first asynchronous clock signal and the second asynchronous clock signal.

15. The method of claim 11, further comprising receiving a start signal at the clocking circuit to allow the start and reset of the first asynchronous clock signal independently and for power saving by stopping the clock at the end of a synchronous approximation cycle.

16. The method of claim 11, further comprising implementing a first start circuit and a second start circuit.

17. The method of claim 11, further comprising coupling a pair of back-to-back invertors coupled between a first output for generating the first asynchronous clock signal and a second output for generating the second asynchronous clock signal.

18. The method of claim 11, further comprising receiving input data to implement a successive approximation register analog-to-digital converter.

19. The method of claim 18, wherein the successive approximation registers analog-to-digital converter is coupled to outputs of the first comparator and the second comparator.

20. The method of claim 18, further comprising implementing a capacitive digital-to-analog converter having a first plurality of capacitors coupled to the first input of the first comparator and the second comparator and a second plurality of capacitors coupled to a second input of the first comparator and the second comparator.

* * * * *